US006734374B2

(12) United States Patent
Tang

(10) Patent No.: US 6,734,374 B2
(45) Date of Patent: May 11, 2004

(54) MICRO-COAXIAL CABLE ASSEMBLY AND METHOD FOR MAKING THE SAME

(75) Inventor: Chiu Yu Tang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/161,464

(22) Filed: May 30, 2002

(65) Prior Publication Data

US 2003/0221866 A1 Dec. 4, 2003

(51) Int. Cl.$^{7}$ .......................... H05K 1/11; H91R 12/04

(52) U.S. Cl. ...................... 174/261; 174/78; 174/88 C; 174/250; 439/92

(58) Field of Search ................................ 174/261, 250, 174/78, 102 R, 36, 88 C; 439/579, 610, 9 E

(56) References Cited

U.S. PATENT DOCUMENTS 5,281,762 A * 1/1994 Long et al. .................. 174/78
5,347,711 A * 9/1994 Wheatcraft et al. ........... 29/843
5,387,764 A * 2/1995 Blom et al. ................. 174/261
5,482,475 A * 1/1996 Kawaguchi ................. 439/394
5,781,991 A * 7/1998 Papon ......................... 29/828
5,931,692 A * 8/1999 Medina ...................... 439/497
5,975,944 A * 11/1999 Medina et al. .............. 439/493
6,031,185 A * 2/2000 Bouveret et al. ......... 174/84 R
6,326,548 B1 * 12/2001 Okumura et al. ......... 174/88 C
6,336,827 B1 * 1/2002 Akama et al. .............. 439/610

* cited by examiner

*Primary Examiner*—David A. Zarncke
*Assistant Examiner*—I B Patel
(74) *Attorney, Agent, or Firm*—Wei Te Chung

(57) ABSTRACT

A method for soldering braiding layers of wires of a micro-coaxial cable to a substrate, wherein each wire includes a core conductor, an inner insulator, a braiding layer, and an outer insulator, comprises the steps of: exposing the braiding layers of the wires; providing a substrate having a thick layer of fusible element thereon; and arranging the braiding layers to the thick layer of the substrate while providing enough energy such that molten fusible element is substantially filled in interstitial space between the braiding layers of adjacent individual wires. An electrical cable assembly made by the above method is also disclosed.

4 Claims, 7 Drawing Sheets

MICRO-COAXIAL CABLE ASSEMBLY AND METHOD FOR MAKING THE SAME

BACKGROUND OF THE INVENTION

1. Field of the Invention

The present invention relates to a micro-coaxial cable assembly and a method for making the same, and particularly to a method for stably and conveniently soldering braiding layers of a micro-coaxial cable to a substrate.

2. Description of Related Art

A micro-coaxial cable configured by a plurality of individual wires is usually used for signal transmission between two internal components of a computer. Each individual wire generally includes a core conductor, an inner insulator made from Teflon coated over the core conductor, a metal braiding surrounding the inner insulator for preventing cross talk between adjacent wires, and an outer insulator made from plastic material.

Generally, the micro-coaxial cable is connected with a connector via a transition printed circuit board (PCB). U.S. Pat. No. 5,199,885 discloses a certain type of connector (tradename: MICTOR, manufactured and distributed by AMP Incorporation) which can be used with the micro-coaxial cable. The Mictor connector contains two rows of signal terminals and a grounding bus disposed therebetween. Tails of the signal terminals are arranged in a straddle manner and the grounding bus has a plurality of grounding legs extending between the tails. The transition PCB is formed with conductive pads on top and bottom surfaces for electrical connection with the straddle tails. The PCB is further formed with inner grounding planes to be connected with the grounding legs of the grounding bus of the Mictor connector, as disclosed in the '885 patent. In addition, the top and bottom surfaces are formed with grounding pads which are interconnected with the grounding planes within the printed circuit board. Before the micro-coaxial cable can be soldered to the transition printed circuit board, it must be subject to certain machining processes, namely 1) stripping the outer insulator to expose the braiding; 2) removing a section of the braiding while leaving a short length thereon; and 3) removing a certain length of the inner insulator to expose the core conductor. After these processes are completed, the core conductors of the micro-coaxial cable are soldered to the conductive pads on the PCB. The braiding layers of the wires are soldered to the grounding pads on the PCB for EMI (Electromagnetic Interference) protection. Thus, a micro-coaxial cable connector assembly is formed.

Before soldering the core conductors and the braiding layers of the wires to the PCB, the conductive and grounding pads of the PCB are individually precoated with solder paste. However, after applying heat to the solder paste, the braiding layer of each wire is connected with the PCB only at a hemline of the braiding layer and a gap between every two adjacent braiding layers has no solder filled therein. Therefore, the connection between the braiding layers of the cable and the PCB is not reliable. When the micro-coaxial cable connector assembly is subject to an external force, the connection between the braiding layers of the wires and the PCB is easy to break and thus the grounding effect is adversely affected Hence, an improved method for soldering braiding layers of a micro-coaxial cable to a printed circuit board is desired to overcome the disadvantages of the related art.

SUMMARY OF THE INVENTION

The main object of the present invention is to provide a method for stably and conveniently soldering braiding layers of a micro-coaxial cable to a printed circuit board, thereby ensuring a reliable grounding effect.

To achieve the above-mentioned object, an improved method for connecting braiding layers of a micro-coaxial cable to a printed circuit board is disclosed by the present invention, wherein the micro-coaxial cable consists of a plurality of individual wires each including a core conductor, an inner insulator coated over the core conductor, a braiding layer surrounding the inner insulator, and an outer insulator coated over the braiding layer. The method comprises the steps of: exposing the braiding layers of the wires; providing a substrate having a thick layer of fusible element thereon; and arranging the braiding layers onto the thick layer of fusible element while providing enough energy such that molten fusible element is substantially filled in interstitial space between the braiding layers of adjacent individual wires.

Other objects, advantages and novel features of the invention will become more apparent from the following detailed description of the present embodiment when taken in conjunction with the accompanying drawings.

DETAILED DESCRIPTION OF THE INVENTION

Figure 1:
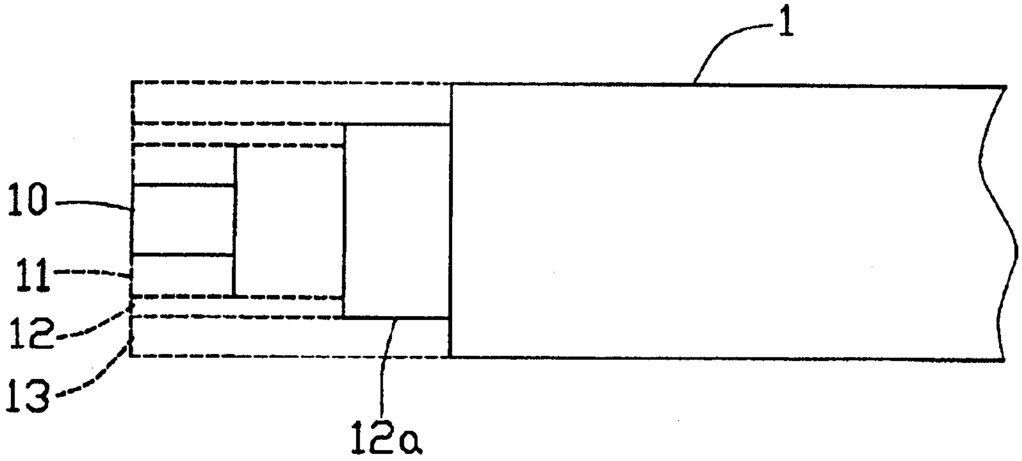
FIG. 1 is a side, elevational view of a wire of a micro-coaxial cable used with the present invention.
Figure 2A:
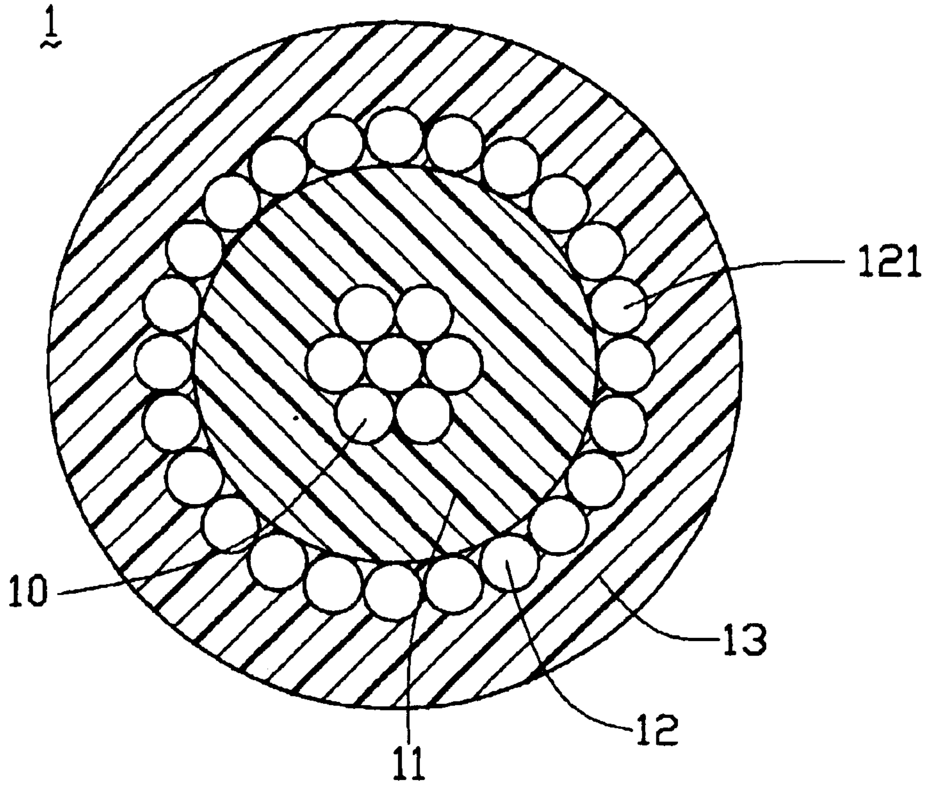
FIG. 2A is a cross-sectional view of the wire shown in FIG. 1.

A micro-coaxial cable used with the present invention is configured by a plurality of individual wires arranged in a side-by-side manner. Referring to FIGS. 1 and 2A, each wire 1 includes a core conductor 10, a layer of inner insulator 11 coated over the core conductor 10, a layer of metal braiding 12 surrounding the inner insulator 11, and a layer of outer insulator 13 coated over the braiding layer 12. The inner insulator 11 can be selected from a variety of insulation material, such as Teflon. According to the present invention, the braiding layer 12 is braided by a plurality of strands 121 to prevent cross talk between core conductors 10 of adjacent wires 1.

Figure 2B:
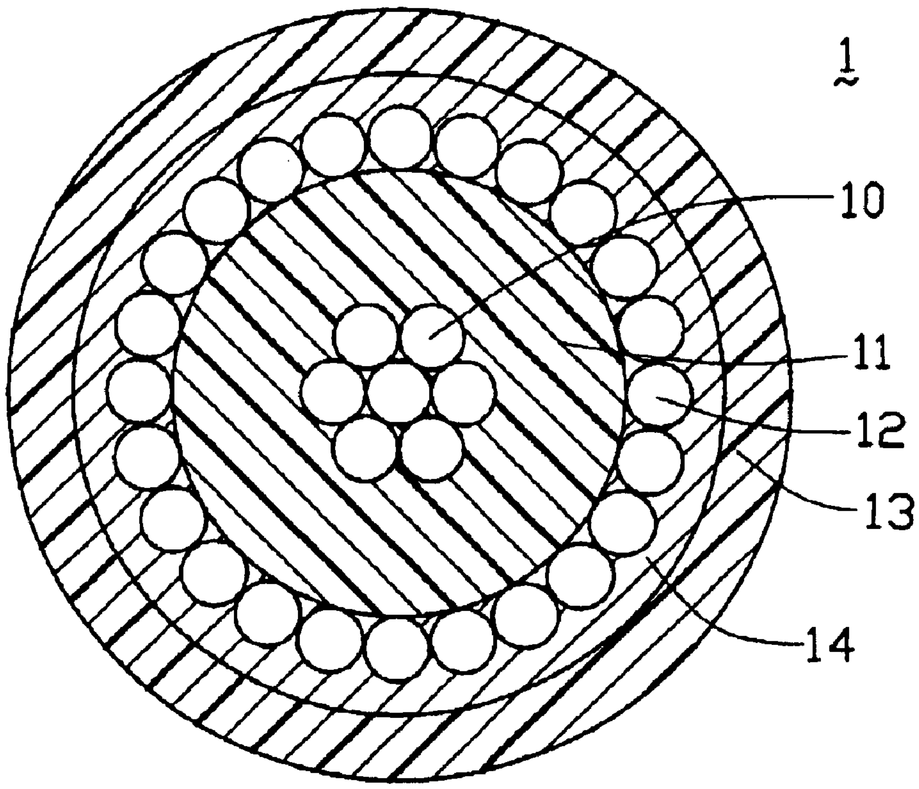
FIG. 2B is a cross-sectional view similar to FIG. 2A, but with a section of an outer insulator of the wire removed and with a layer of solder coated on an exposed braiding layer of the wire.

A section of the outer insulator 13 is stripped from the wire 1 to expose a segment 12*a* of the braiding layer 12 for being soldered to a substrate, such as a printed circuit board, a metal strip and so on, for EMI protection. In a preferred embodiment of the present invention, the substrate is a printed circuit board 20 (shown in FIG. 3A). Further referring to FIG. 2B, preferably, the exposed segment 12*a* may be dipped into a molten solder bath (not shown) such that a solder layer 14 is coated over the segment 12*a*. When the wires 1 are soldered to the printed circuit board 20, the solder layers 14 will further ensure a reliable connection between the wires 1 and the printed circuit board 20.

Figure 3A:
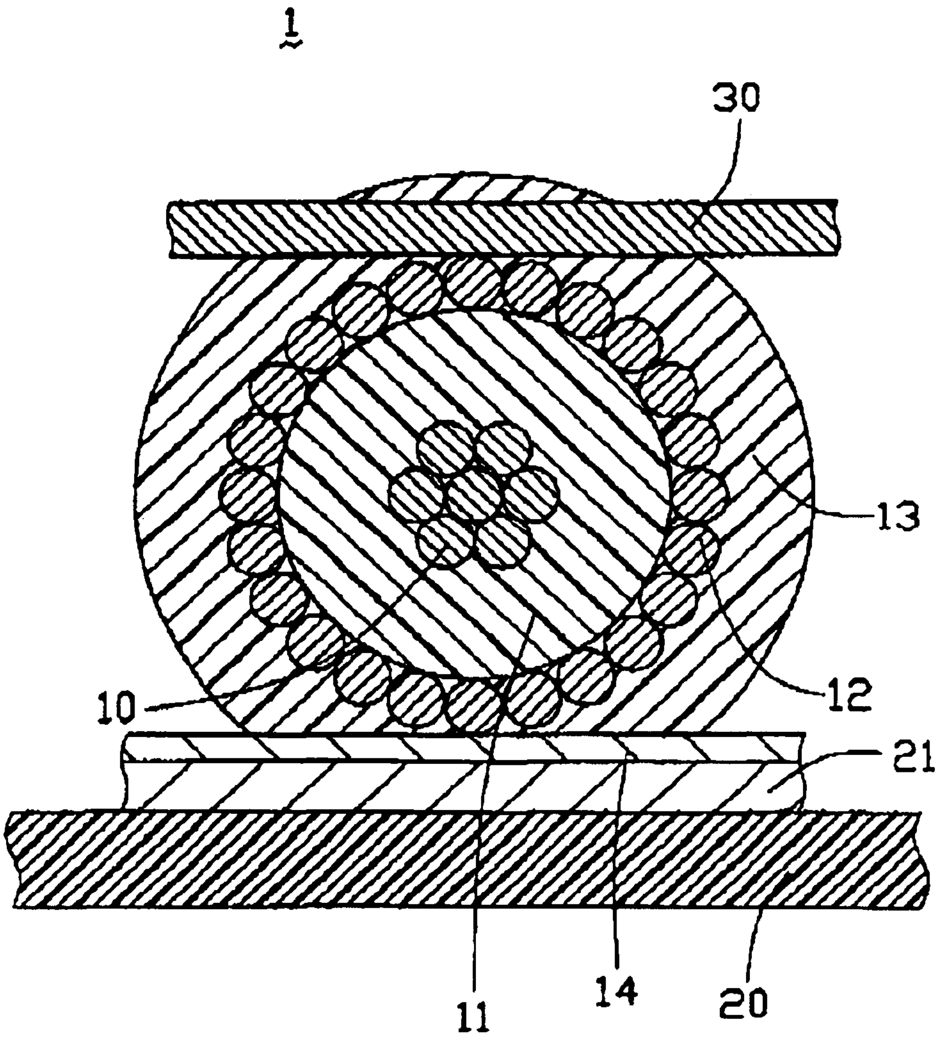
FIG. 3A is a cross-sectional view showing a first embodiment of a connection between the braiding layer of the wire and a printed circuit board.
Figure 3B:
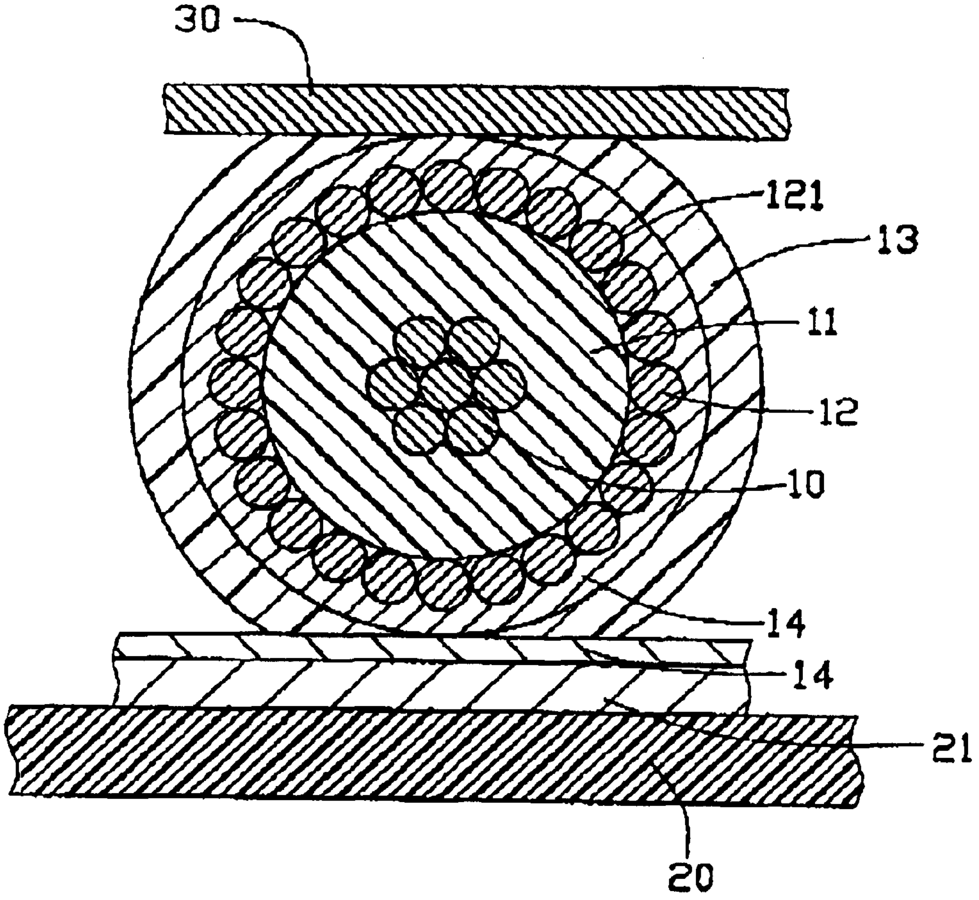
FIG. 3B is a cross-sectional view showing a second embodiment of a connection between the braiding layer of the wire and a printed circuit board.
Figure 4:
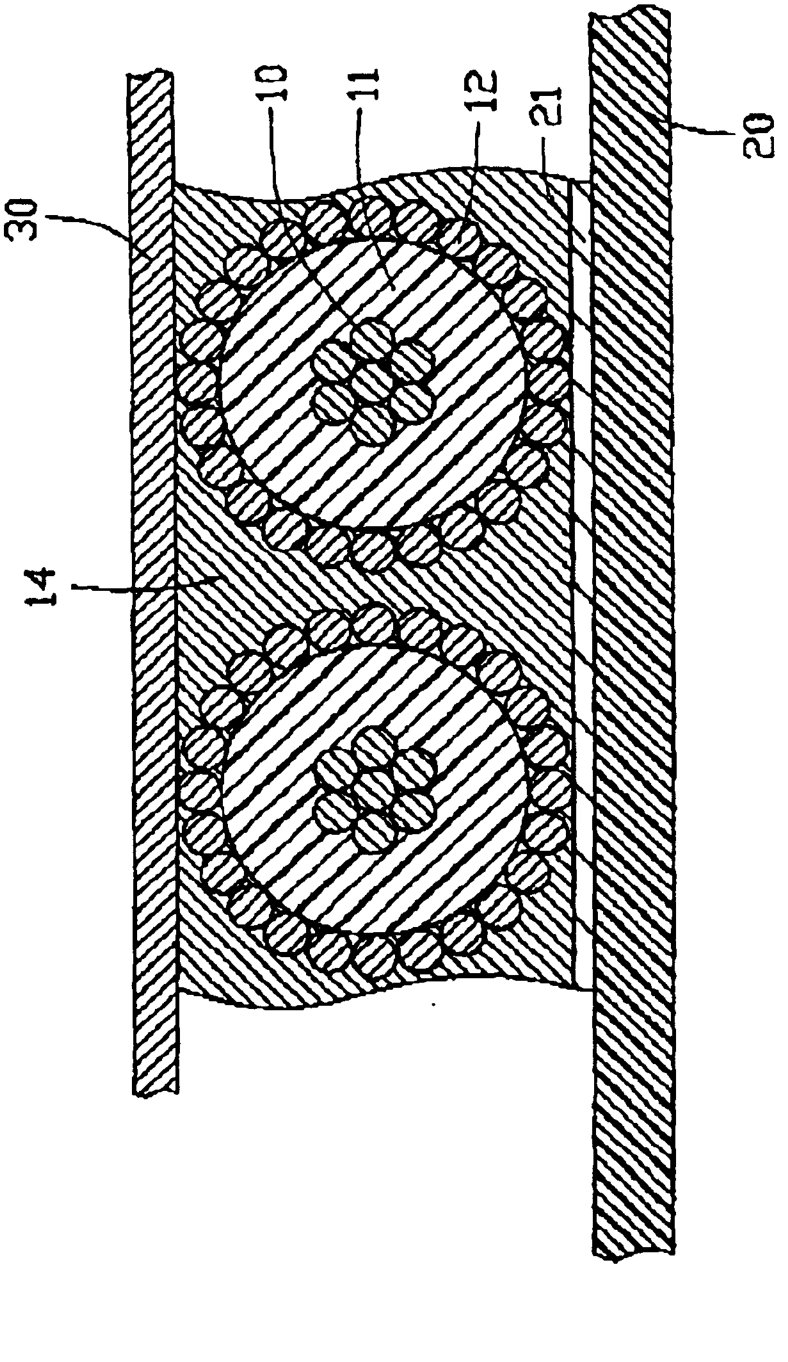
FIG. 4 is a cross-sectional view showing a connection between the braiding layers of two adjacent wires and a printed circuit board.
Figure 5:
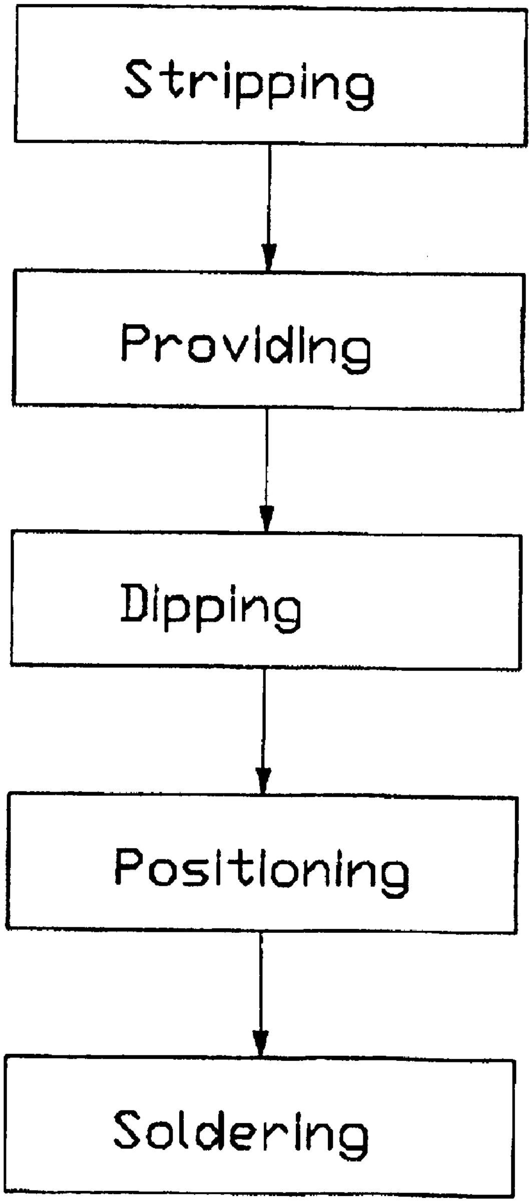
FIG. 5 is a flow chart of a method according to the present invention.

Referring to FIGS. 3A, 3B and 4, the printed circuit board 20 is formed with a ground conductive pad 21 for electrical connection with the braiding layers 12 of the wires 1 for EMI (Electromagnetic Interference) protection. Before the braiding layers 12 of the wires 1 are soldered to the ground conductive pad 21 on the printed circuit board 20, the printed circuit board 20 is dipped into the molten solder bath such that a solder layer 14 of a certain thickness is coated on the ground conductive pad 21. After the wires 1 are positioned on the solder layer 14 in a side-by-side manner, a metal plate 30 is applied to the braiding layers 12 to conduct heat from an iron (not shown). The reflow temperature is selected as the melting point of the solder 14. After the solder 14 is melted, by the effect of siphonage, interstitial space between the exposed segments 12*a* of adjacent braiding layers 12 is filled with the solder 14. In addition, interstitial space between the exposed segment 12*a* and the ground conductive pad 21 of the printed circuit board 20 is also filled with the solder 14. Therefore, when the melten solder 14 is cooled and solidified, the braiding layers 12 of the wires 1 are perfectly connected with the ground pad 21 of the printed circuit board 20. Meanwhile, the braiding layers 12 of the wires 1 are also connected with the metal plate 30 via the solder 14 for ESD (Electrostatic Discharge) protection.

It is noted that during the process of soldering the wires 1 to the printed circuit board 20, the metal plate 30 also provides certain pressure to make the braiding layers 12 snugly abutting against the solder paste 14, thereby increasing connecting area between the braiding layers 12 and the solder layer 14 to ensure a reliable connection therebetween. Furthermore, the interstitial space between the braiding layers 12 of the adjacent individual wires 1 are filled with the solder 14 to further ensure a reliable connection between the braiding layers 12 and the printed circuit board 20. Therefore, a stable and lasting ground effect of the micro-coaxial cable assembly is obtained.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical cable assembly comprising:

a substrate having a sufficient quantity of fusible element pre-disposed thereon; and a cable having a plurality of wires, each wire including a core conductor, an inner insulator, a braiding layer, and an outer insulator, the braiding layers of the wires being connected with the substrate, interstitial space between the braiding layers of adjacent individual wires being substantially filled with fusible element after melting and solidifying the fusible element.

2. The electrical cable assembly as claimed in claim 1, further comprising a metal plate being connected with the braiding layers of the wires for Electrostatic Discharge protection.

3. The electrical cable assembly as claimed in claim 1, wherein the substrate is a printed circuit board.

4. An electrical cable assembly comprising:

a printed circuit board having a grounding pad;

a cable including a plurality of juxtaposed wires each having a core conductor, an inner insulator, a braiding layer and an outer insulator successively coaxially arranged with one another; and a metal plate cooperating with the grounding pad to sandwich the braiding layers of said wires therebetween; wherein at least either said grounding pad or said braiding layers is equipped with a sufficient quantity of a fusible element to not only solder the braiding layers to both the grounding pad and the metal plate but also solder every adjacent two braiding layers together via a reflow procedure.

* * * * *